(12) United States Patent
Perunka et al.

(10) Patent No.: US 11,891,272 B2
(45) Date of Patent: Feb. 6, 2024

(54) ENERGY STORAGE MANAGEMENT SYSTEM

(71) Applicant: KONE Corporation, Helsinki (FI)

(72) Inventors: Pekka Perunka, Helsinki (FI); Pekka Perälä, Helsinki (FI); Tapio Tyni, Helsinki (FI); Janne Öfversten, Helsinki (FI); Ari Hänninen, Helsinki (FI)

(73) Assignee: KONE CORPORATION, Helsinki (FI)

( * ) Notice: Subject to any disclaimer, the term of this patent is extended or adjusted under 35 U.S.C. 154(b) by 1494 days.

(21) Appl. No.: 16/168,502

(22) Filed: Oct. 23, 2018

(65) Prior Publication Data

US 2019/0135578 A1    May 9, 2019

(30) Foreign Application Priority Data

Nov. 7, 2017  (EP) .................................... 17200334

(51) Int. Cl.
| | |
|---|---|
| B66B 1/24 | (2006.01) |
| B66B 1/30 | (2006.01) |
| G01R 31/385 | (2019.01) |
| H02J 1/10 | (2006.01) |
| H02J 3/00 | (2006.01) |
| G01R 35/00 | (2006.01) |

(52) U.S. Cl.
CPC .............. B66B 1/2408 (2013.01); B66B 1/30 (2013.01); B66B 1/302 (2013.01); G01R 31/385 (2019.01); H02J 1/106 (2020.01); H02J 3/003 (2020.01); *G01R 35/00* (2013.01)

(58) Field of Classification Search
CPC ....... B66B 1/2408; B66B 1/30; G01R 31/385; G01R 35/00; H02J 1/106; H02J 3/003
See application file for complete search history.

(56) References Cited

U.S. PATENT DOCUMENTS

| | | | |
|---|---|---|---|
| 2006/0243536 A1* | 11/2006 | Tyni | B66B 1/2408 187/382 |
| 2008/0283341 A1* | 11/2008 | Aulanko | B66B 1/302 187/289 |
| 2011/0120811 A1* | 5/2011 | Kallioniemi | B66B 1/2458 187/382 |
| 2014/0008155 A1 | 1/2014 | Rossignol | |
| 2014/0166407 A1 | 6/2014 | Sonnenmoser | |
| 2015/0375959 A1* | 12/2015 | Agirman | B66B 5/14 187/247 |
| 2016/0244294 A1 | 8/2016 | Kim | |

OTHER PUBLICATIONS

Extended European Search Report, issued in Priority Application No. 17200334.5, dated May 15, 2018.

* cited by examiner

*Primary Examiner* — Son T Le
*Assistant Examiner* — Adam S Clarke
(74) *Attorney, Agent, or Firm* — Birch, Stewart, Kolasch & Birch, LLP

(57) ABSTRACT

A method for allocating capacity of an energy storage associated with at least one passenger transport installation includes continuously monitoring performance data of the energy storage; obtaining first data associated with operating the at least one passenger transport installation; identifying different uses for the energy stored in the energy storage; determining an allocation of energy storage capacity available for the different uses based on the performance data and the first data; and applying the determined allocation.

17 Claims, 2 Drawing Sheets

ENERGY STORAGE MANAGEMENT SYSTEM

BACKGROUND

Passenger transport installations, for example, elevators, have traditionally used batteries for providing backup power usage for critical systems, enabling, for example, rescue functionality and allowing uninterrupted operation during a power failure. In the backup power use, except for the rare occasions that a power failure actually occurs, the battery is heavily underutilized during its lifetime.

It would be beneficial to have a solution that would enable more effective utilization of the batteries coupled to passenger transport installations.

SUMMARY

According to at least some of the aspects, a solution is provided that optimizes the allocation of capacity of an energy storage associated with at least one passenger transport installation for different uses or applications.

According to a first aspect of the invention, there is provided a method for allocating capacity of at least one energy storage associated with at least one passenger transport installation. The method comprises continuously monitoring performance data of the at least one energy storage; obtaining first data associated with operating the at least one passenger transport installation; identifying different uses for the energy stored in the at least one energy storage; determining an allocation of energy storage capacity available for the different uses based on the performance data and the first data; and applying the determined allocation. This may provide a solution that optimizes the allocation of capacity of at least one energy storage associated with at least one passenger transport installation for different uses or applications within a building or an otherwise reduced local area. The different uses may refer, for example, to peak power shaving, local renewable energy optimization or backup power for the at least one passenger transport installation.

In an embodiment, the method comprises obtaining second data from at least one external data source, the second data being independent from operating the at least one passenger transport installation; and determining the allocation of the energy storage capacity available for the different uses based on the performance data, the first data and the second data. This may provide a centrally-controllable solution that optimizes the allocation of capacity of at least one energy storage associated with at least one passenger transport installation for different uses or applications within a building or otherwise reduced local area or even within several buildings or an otherwise larger area, such as a fleet of elevators.

In an embodiment, additionally or alternatively, the first data comprises at least one of traffic forecast data or load forecast data of the at least one passenger transport installation. Traffic information may be obtained from any suitable data provider, such as access control systems, proximity sensors, cameras etc.

In an embodiment, additionally or alternatively, the second data comprises at least one of weather forecast data, utility signal data, grid frequency measurement data, grid voltage measurement data, locally produced energy data (for example, solar photovoltaic load profile data), building load data, electricity cost data, or demand response market data. Grid voltage measurement data may be used to regulate the grid voltage with the energy storage. This is beneficial, for example, if the voltage grid is weak, such as a microgrid with small local electricity providers, such as wind generators and/or solar power plants.

In an embodiment, additionally or alternatively, determining an optimal allocation of energy storage capacity available for different uses comprises determining allocation for at least one of a demand response, frequency regulation, peak power shaving, local renewable energy optimization, such as solar photovoltaic optimization, or backup power for the at least one passenger transport installation. In an embodiment, the allocation may be determined also for voltage control and/or load shifting.

In an embodiment, additionally or alternatively, the performance data comprises at least one of a charge state, a charge cycle, a load profile, a health state or the maximum charging and discharging current or power of the at least one energy storage.

In an embodiment, additionally or alternatively, the method further comprises sending data relating to an allocation of energy storage capacity available for at least one of demand response, frequency regulation, grid voltage regulation or local renewable energy optimization uses to an external control platform; receiving an activation signal from the external control platform instructing to implement power grid balancing functions; and taking the activation signal into account in determining the allocation of the energy storage capacity available for the different uses.

According to a second aspect of the invention, there is provided an energy storage management system for allocating capacity of at least one energy storage associated with at least one passenger transport installation. The system comprises means for continuously monitoring performance data of the at least one energy storage; means for obtaining first data associated with operating the at least one passenger transport installation; means for identifying different uses for the energy stored in the at least one energy storage; means for determining an allocation of energy storage capacity available for the different uses based on the performance data and the first data; and means for applying the determined allocation. This may provide a solution that optimizes the allocation of capacity of at least one energy storage associated with at least one passenger transport installation for different uses or applications within a building or an otherwise reduced local area. The different uses may refer, for example, to peak power shaving, local renewable energy optimization or backup power for the at least one passenger transport installation.

In an embodiment, the system comprises means for obtaining second data from at least one external data source, the second data being independent from operating the at least one passenger transport installation; and means for determining the allocation of the energy storage capacity available for the different uses based on the performance data, the first data and the second data. This may provide a centrally-controllable solution that optimizes the allocation of capacity of at least one energy storage associated with at least one passenger transport installation for different uses or applications within a building or otherwise reduced local area or even within several buildings or an otherwise larger area, such as a fleet of elevators.

In an embodiment, the first data comprises at least one of traffic forecast data or load forecast data of the at least one passenger transport installation. Traffic information may be obtained from any suitable data provider, such as access control systems, proximity sensors, cameras etc.

In an embodiment, additionally or alternatively, the second data comprises at least one of weather forecast data, utility signal data, grid frequency measurement data, grid voltage measurement data, locally produced energy data (for example, solar photovoltaic load profile data), building load data, electricity cost data, or demand response market data. Grid voltage measurement data may be used to regulate the grid voltage with the energy storage. This is beneficial, for example, if the voltage grid is weak, such as a microgrid with small local electricity providers, such as wind generators and/or solar power plants.

In an embodiment, additionally or alternatively, the means for determining an allocation of energy storage capacity available for different uses are configured to determine the allocation for at least one of a demand response, frequency regulation, peak power shaving, local renewable energy optimization, such solar photovoltaic optimization, or backup power for the at least one passenger transport installation. In an embodiment, the allocation may be determined also for voltage control and/or load shifting.

In an embodiment, additionally or alternatively, the performance data comprises at least one of a state of the charge, a charge cycle, a load profile, a health state or the maximum charging and discharging current or power of the at least one energy storage.

In an embodiment, additionally or alternatively, the system further comprises means for sending data relating to an allocation of energy storage capacity available for at least one of demand response or frequency regulation, grid voltage regulation or local renewable energy optimization uses to an external control platform; means for receiving an activation signal from the external control platform instructing to implement power grid balancing functions; and means for taking the activation signal into account in determining the allocation of the energy storage capacity available for the different uses.

According to a third aspect of the invention, there is provided a computer program comprising program code, which when executed by at least one processing unit, causes the at least one processing unit to perform the method of the first aspect.

According to a fourth aspect of the invention, there is provided a computer readable medium comprising program code, which when executed by at least one processor, causes the at least one processor to perform the method of the first aspect.

According to a fifth aspect, there is provided an apparatus for allocating capacity of at least one energy storage associated with at least one passenger transport installation. The apparatus comprises at least one processor, and at least one memory connected to the at least one processor. The at least one memory stores program instructions that, when executed by the at least one processor, cause the apparatus to continuously monitor performance data of the at least one energy storage; obtain first data associated with operating the at least one passenger transport installation; identify different uses for the energy stored in the at least one energy storage; determine an allocation of energy storage capacity available for the different uses based on the performance data and the first data; and apply the determined allocation.

The above discussed means may be implemented, for example, using at least one processor, at least one processor and at least one memory connected to the at least one processor, or at least one processor, at least one memory connected to the at least one processor and an input/output interface connected to the at least one processor.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
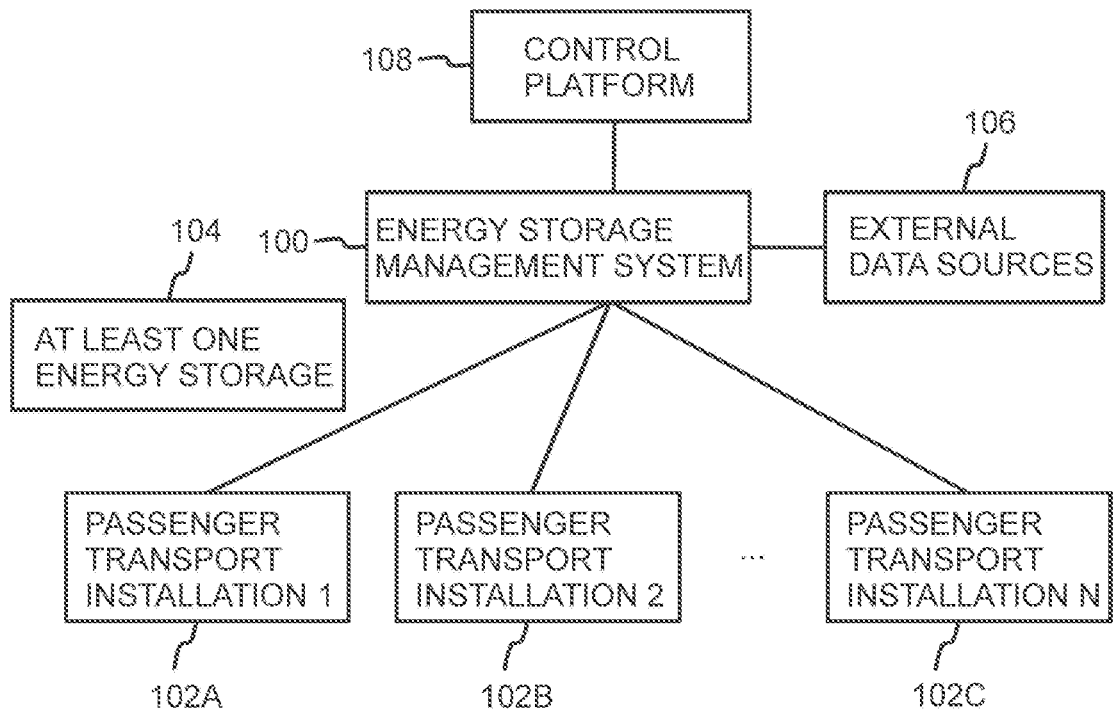
FIG. 1 illustrates a block diagram of a system for dynamically allocating capacity of an energy storage associated with at least one passenger transport installation according to an aspect.

FIG. 1 illustrates a block diagram of a system for dynamically allocating capacity of an energy storage associated with at least one passenger transport installation according to an aspect.

An energy storage management system 100 may be coupled to at least one passenger transport installation 102A, 102B, 102C in a building, for example, to elevators, escalators or conveyers. The energy storage management system 100 may be coupled to, for example, an individual elevator or to a group of elevators. At least one energy storage 104 may be associated with at least one of the passenger transport installations 102A, 102B, 102C. The energy storage management system 100 may also be coupled to external data sources 106 and an external control platform, which may be a control platform 108 configured to aggregate a plurality of power management capacities into a larger resource. The energy storage management system 100 may also control one or more of the at least one energy storage 104. Further, the control platform 108 may simultaneously control one or more energy storage management systems 100.

In a conventional system, the energy storage 104 is only used for providing backup power usage for critical systems, enabling, for example, rescue functionality and allowing uninterrupted operation during power failure. In the backup power use, except for the rare occasions that a power failure actually occurs, the battery is heavily underutilized during its lifetime.

The description illustrates a solution that aims to maximizing energy storage usage and enables providing a range of additional services with the energy storage 104. The solution dynamically optimizes and allocates the share of available energy storage capacity of the at least one energy storage 104 associated with the passenger transport installations 102A, 102B, 102C for different uses.

Figure 2:
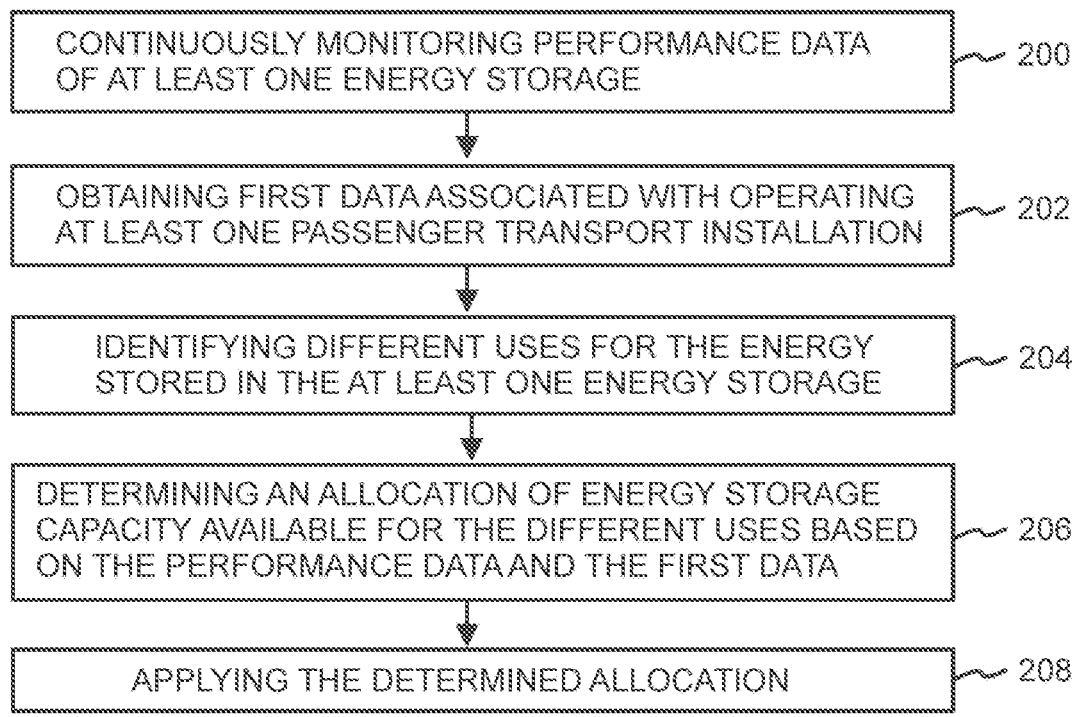
FIG. 2 illustrates a flow diagram of a method for dynamically allocating capacity of an energy storage associated with at least one passenger transport installation according to an aspect.

FIG. 2 illustrates a flow diagram of a method for dynamically allocating capacity of an energy storage 104 associated with at least one passenger transport installation 102A, 102B, 102c according to an aspect.

At 200 performance data of the energy storage 104 is continuously monitored. The performance data of the energy storage may comprise a charge state, a charge cycle, a load profile, a health state and/or the maximum charging and discharging current or power of the at least one energy storage 104.

At 202 first data associated with the operating the at least one passenger transport installation is obtained. The first data may comprise a traffic forecast data or a passenger transport installation load forecast data. The first data may refer to any data that is provided by the system operating the at least one passenger transport installation.

At 204 different uses or applications for the energy stored in the energy storage are identified. The number of uses may not always be the same but can vary.

At 206 an allocation of energy storage capacity available for the different uses is determined based on the performance data and the first data. The available energy storage capacity may be allocated, for example, for at least one of a demand response, frequency regulation, peak power shaving, local renewable energy optimization, such as solar photovoltaic optimization, or backup power for the at least one passenger transport installation. The solar photovoltaic optimization may refer to charging the energy storage with solar energy when the production of solar panels is greater than the demand.

In an embodiment, also second data from at least one external data source is obtained, the second data being independent from operating the at least one passenger transport installation. The second data may comprise at least one of weather forecast data, utility signal data, grid frequency measurement data, solar photovoltaic load profile data, building load data, electricity cost data, or demand response market data. The electricity cost may refer, for example, to an hourly price of electricity in the electricity market or a demand charge for peak electricity usage. Then, also the second data may be used in determining the allocation of energy storage capacity available for the different uses.

Eventually, at 208 the determined allocation is dynamically applied. This may mean that the determined allocation may not be fixed, but varies as a function of time.

The above illustrated process may be continuous so that the process is repeated continuously at predetermined time intervals.

In an embodiment, the data relating to allocation of energy storage capacity available for at least one of demand response or frequency regulation uses is sent to the external control platform 108. In response, an activation signal may be received from the external control platform 108 instructing to implement power grid balancing functions. Thereafter, the activation signal may be taken into account in determining the allocation of the energy storage capacity available for the different uses. The activation signal may comprise, for example, a request for load curtailment for the next five seconds or for a specific amount of energy. As an example, if there is a need to curtail load of a specific energy amount for a predetermined time, the energy storage management system may feed energy from the energy storage to support the load power or even back to the power grid for the requested time period.

Figure 3:
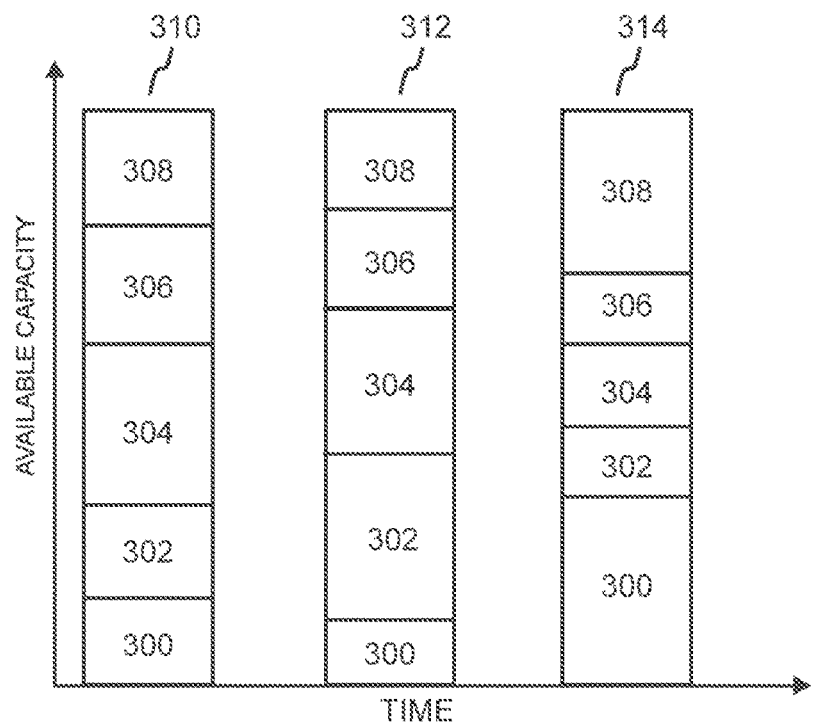
FIG. 3 illustrates a graph of allocating energy storage capacity for a plurality of uses according to an aspect.

FIG. 3 illustrates a graph of allocating energy storage capacity according to an aspect. The graph illustrates that the available energy storage capacity can be divided differently as a function of time, as illustrated by references 310, 312 and 314.

In the example illustrated in FIG. 3, the available capacity has been allocated for five different uses or applications: backup power 300, local renewable energy optimization 302, peak power shaving 304, demand response 306 and frequency regulation 308. It is evident that the number of uses or applications may be less or higher than five. Further, the total available capacity to be shared between the uses may also vary as a function of time.

For example, when a traffic forecast indicates rush hours, a larger share of the available capacity of the at least one energy storage may be allocated for back-up power 300 to ensure uninterrupted operation. Traffic forecasts may be also used to estimate optimal timing to charge the energy storage with regenerated energy when it is coupled to a regenerative power source. During night-time, when the passenger transport installation may be nearly unused, the allocation for back-up power 300 may be optimized to ensure only minimum rescue functionality.

One possible use for the energy storage capacity may be local renewable energy optimization 302, such as solar photovoltaic optimization. The energy storage management system 100 may obtain information on weather and solar photovoltaic load profile, for example, from solar panels connected to a building in order to determine when it is optimal to charge the energy storage with excess solar energy left over from feeding the building load. The at least one energy storage 104 may also be charged from the power grid during low-priced electricity or to provide source of night-time load for the grid.

Power demand of some installations, such as elevator systems, is extremely volatile. Short peaks in power demand may be up to 30 times as high as the average demand resulting in significant transient peaks in a building power demand. The energy storage management system 100 may reduce peak power demand by allocating a share of energy storage capacity for peak power shaving 304, for example, based on load forecasts and electricity cost data indicating high demand charges.

In an embodiment, based on electricity market data, larger share may be allocated for demand response 306 and frequency regulation 308 when incentives are higher. Moreover, a plurality of energy storage management systems may be communicatively connected to an external control platform enabling them to provide grid services as an aggregated resource. By combining plurality of energy storages into a larger resource, they can participate in market auctions offering their combined reserve for use in the demand response markets.

The demand response may refer to shifting power load according to external signals, such as electricity price or utility signals, from high-demand moments to low-demand moments. The demand response may also refer to temporarily adjusting consumption for balancing a power system in return to incentive payments from the grid operator or savings in the electricity bill. Demand response market places comprise, among others, frequency controlled reserve and balancing power markets for enabling fast balancing of the power system. Frequency controlled reserves perform frequency regulation, which means adjusting load and/or production when power grid frequency drifts from its nominal value in order to balance the demand. The grid frequency fluctuates constantly, and fast assets provide particularly valuable reserve enabling timely corrections. Energy storage technologies may be used as a fast asset, since they can perform regulation even on a second-level.

Figure 4:
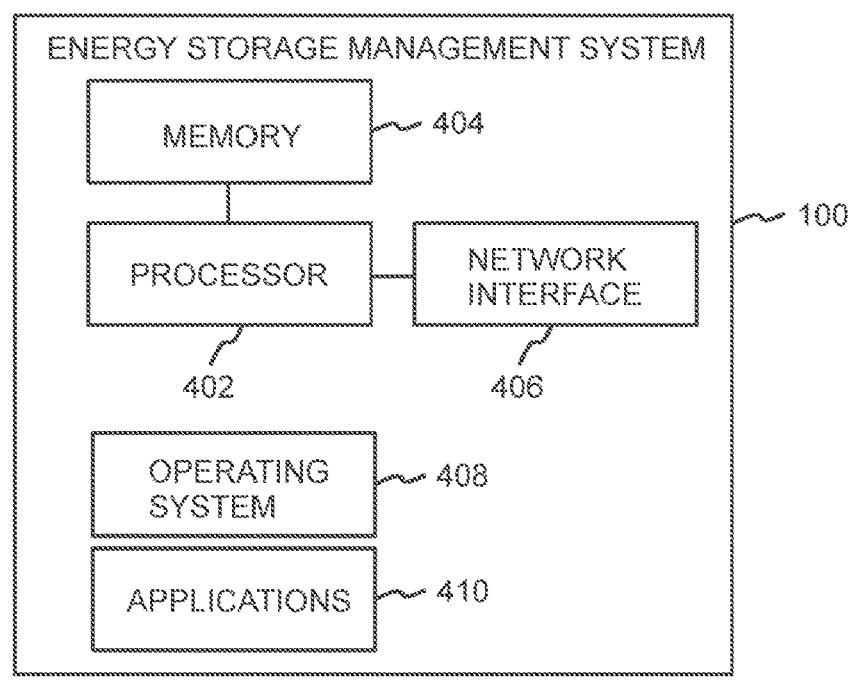
FIG. 4 illustrates a block diagram of a system for dynamically allocating capacity of an energy storage associated with at least one passenger transport installation according to an aspect.

FIG. 4 illustrates a block diagram of an energy storage management system 100 for dynamically allocating capacity of at least one energy storage 104 associated with at least one passenger transport installation 102A, 102B, 102C according to an aspect.

The illustrated energy storage management system 100 can include a controller or processor 402 (e.g., signal processor, microprocessor, ASIC, or other control and processing logic circuitry) for performing such tasks as signal coding, data processing, input/output processing, power control, and/or other functions. The energy storage management system 100 can include a memory or memories 404. The memory 404 can include non-removable memory and/or removable memory. The non-removable memory can include RAM, ROM, flash memory, a hard disk, or other well-known memory storage technologies. The memory 404 can be used for storing data and/or code for running one or more applications.

The energy storage management system 100 may comprise an input/output interface enabling the energy storage management system 100 to communicate with other apparatuses. The energy storage management system 100 may further comprise a network interface 406 enabling communication with external devices or networks. The network interface 406 may include a wired or wireless transceiver for communicating with the external devices or networks. The memory 404 may store operating system software 408 that controls the operations of the energy storage management system 100. The memory 404 may also comprise one or more applications 410 that can be executed by the processor 402. The illustrated components of the energy storage management system 100 are all-inclusive, as any components can deleted and other components can be added.

In an embodiment, the at least one memory 404 may store program instructions that, when executed by the at least one processor 402, cause the energy storage management system 100 to continuously monitor performance data of the at least one energy storage, obtain first data associated with operating the at least one passenger transport installation, identify different uses for the energy stored in the energy storage, determine an allocation of energy storage capacity available for the different uses based on the performance data and the first data, and apply the determined allocation.

Further, in an embodiment, any combination of the illustrated components disclosed in FIG. 4, for example, at least one of the processor 402 and the memory 404 may constitute means for continuously monitoring performance data of the at least one energy storage, means for obtaining first data associated with operating the at least one passenger transport installation, means for identifying different uses for the energy stored in the energy storage, means for determining an allocation of energy storage capacity available for the different uses based on the performance data and the first data, and means for applying the determined allocation.

The above illustrated solution may provide at least some of the following effects. By optimizing and allocating the share of energy storage capacity for different applications, the level of energy storage utilization significantly increases. Thus, the solution also offsets the expensive capital investment in back-up power capacity. The more efficient use of energy storage capacity helps in mitigating peak power in installations with highly volatile load, thus lowering the capacity requirements for building power distribution system, such as the cost of feeder cables, transformers, UPS, and back-up power generators. In addition, the use of on-site solar power consumption can be maximized, and simultaneously mitigate the need for multiple energy storages in same building. Moreover, the solution advantageously helps in stabilizing the power grid.

Example embodiments may be implemented in software, hardware, application logic or a combination of software, hardware and application logic. The example embodiments can store information relating to various methods described herein. This information can be stored in one or more memories, such as a hard disk, optical disk, magneto-optical disk, RAM, and the like.

One or more databases can store the information used to implement the example embodiments. The databases can be organized using data structures (e.g., records, tables, arrays, fields, graphs, trees, lists, and the like) included in one or more memories or storage devices listed herein. The methods described with respect to the example embodiments can include appropriate data structures for storing data collected and/or generated by the methods of the devices and subsystems of the example embodiments in one or more databases.

All or a portion of the example embodiments can be conveniently implemented using one or more general purpose processors, microprocessors, digital signal processors, micro-controllers, and the like, programmed according to the teachings of the example embodiments, as will be appreciated by those skilled in the computer and/or software art(s). Appropriate software can be readily prepared by programmers of ordinary skill based on the teachings of the example embodiments, as will be appreciated by those skilled in the software art. In addition, the example embodiments can be implemented by the preparation of application-specific integrated circuits or by interconnecting an appropriate network of conventional component circuits, as will be appreciated by those skilled in the electrical art(s). Thus, the examples are not limited to any specific combination of hardware and/or software. Stored on any one or on a combination of computer readable media, the examples can include software for controlling the components of the example embodiments, for driving the components of the example embodiments, for enabling the components of the example embodiments to interact with a human user, and the like. Such computer readable media further can include a computer program for performing all or a portion (if processing is distributed) of the processing performed in implementing the example embodiments. Computer code devices of the examples may include any suitable interpretable or executable code mechanism, including but not limited to scripts, interpretable programs, dynamic link libraries (DLLs), Java classes and applets, complete executable programs, and the like. In the context of this document, a "computer-readable medium" may be any media or means that can contain, store, communicate, propagate or transport the instructions for use by or in connection with an instruction execution system, apparatus, or device, such as a computer. A computer-readable medium may include a computer-readable storage medium that may be any media or means that can contain or store the instructions for use by or in connection with an instruction execution system, apparatus, or device, such as a computer. A computer readable medium can include any suitable medium that participates in providing instructions to a processor for execution. Such a medium can take many forms, including but not limited to, non-volatile media, volatile media, transmission media, and the like.

While there have been shown and described and pointed out fundamental novel features as applied to preferred embodiments thereof, it will be understood that various omissions and substitutions and changes in the form and details of the devices and methods described may be made by those skilled in the art without departing from the spirit of the disclosure. For example, it is expressly intended that all combinations of those elements and/or method steps which perform substantially the same function in substantially the same way to achieve the same results are within the scope of the disclosure. Moreover, it should be recognized that structures and/or elements and/or method steps shown and/or described in connection with any disclosed form or embodiments may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

The invention claimed is:

1. A method for allocating capacity of at least one energy storage associated with at least one passenger transport installation, the method comprising:
   continuously monitoring performance data of the at least one energy storage;
   obtaining first data associated with operating the at least one passenger transport installation;
   identifying different uses for the energy stored in the at least one energy storage;
   determining an allocation of energy storage capacity available for the different uses based on the performance data and the first data; and
   applying the determined allocation of energy storage capacity to the different uses to an operation of the at least one passenger transport installation,
   wherein the first data comprises at least one of traffic forecast data or load forecast data of the at least one passenger transport installation.

2. The method of claim 1, further comprising:
   obtaining second data from at least one external data source, the second data being independent from operating the at least one passenger transport installation; and
   determining the allocation of the energy storage capacity available for the different uses based on the performance data, the first data and the second data.

3. The method of claim 2, wherein the second data comprises at least one of weather forecast data, utility signal data, grid frequency measurement data, solar photovoltaic load profile data, building load data, electricity cost data, or demand response market data.

4. The method of claim 1, wherein determining the allocation of energy storage capacity available for different uses comprises determining allocation for at least one of a demand response, frequency regulation, peak power shaving, solar photovoltaic optimization, or backup power for the at least one passenger transport installation.

5. The method of claim 1, wherein the performance data comprises at least one of a charge state, a charge cycle, a load profile, a health state or the maximum charging and discharging current or power of the at least one energy storage.

6. The method of claim 1, further comprising:
   sending data relating to the allocation of energy storage capacity available for at least one of demand response, frequency regulation, grid voltage regulation or local renewable energy optimization uses to an external control platform;
   receiving an activation signal from the external control platform instructing to implement power grid balancing functions; and
   taking the activation signal into account in determining the allocation of the energy storage capacity available for the different uses.

7. A computer program comprising a non-transitory computer-readable storage medium having program code stored therein, which when executed by at least one processing unit, causes the at least one processor to perform the method of claim 1.

8. A non-transitory computer readable medium comprising program code, which when executed by at least one processor, causes the at least one processor to perform the method of claim 1.

9. The method of claim 2, wherein determining the allocation of energy storage capacity available for different uses comprises determining allocation for at least one of a demand response, frequency regulation, peak power shaving, solar photovoltaic optimization, or backup power for the at least one passenger transport installation.

10. The method of claim 1, wherein the allocation of energy storage capacity available for the different uses is dynamically determined and the determined allocation is not fixed, such that available capacity of the energy storage allocated for each of the different uses varies as a function of time.

11. The method of claim 1, wherein the available capacity of the energy storage is allocated to the different uses as a function of time and is dynamically applied to the different uses as a function of time, and wherein the method further comprises the step of operating the at least one passenger transport installation with optimized utilization of the at least one energy storage according to the dynamically applied allocation.

12. An energy storage management system for allocating capacity of at least one energy storage associated with at least one passenger transport installation, the system comprising:
   a memory, and a processor, wherein the processor is configured to:
     continuously monitor performance data of the at least one energy storage;
     obtain first data associated with operating the at least one passenger transport installation;
     identify different uses for the energy stored in the at least one energy storage;
     determine an allocation of energy storage capacity available for the different uses based on the performance data and the first data; and
     apply the determined allocation of energy storage capacity to the different uses so as to optimize share of the energy stored in the at least one energy storage,
   wherein the first data comprises at least one of traffic forecast data or load forecast data of the at least one passenger transport installation.

13. The system of claim 12, further comprising a network interface, wherein the processor is further configured to:
obtain second data from at least one external data source through the network interface, the second data being independent from operating the at least one passenger transport installation; and
determine the allocation of the energy storage capacity available for the different uses based on the performance data, the first data and the second data.

14. The system of claim 13, wherein the second data comprises at least one of weather forecast data, utility signal data, grid frequency measurement data, solar photovoltaic load profile data, building load data, electricity cost data, or demand response market data.

15. The system of claim 12, wherein the means for determining an allocation of energy storage capacity available for different uses are configured to determine the allocation for at least one of a demand response, frequency regulation, peak power shaving, solar photovoltaic optimization, or backup power for the at least one passenger transport installation.

16. The system of claim 12, wherein the performance data comprises at least one of a charge state, a charge cycle, a load profile, a health state or the maximum charging and discharging current or power of the at least one energy storage.

17. The system of claim 12, further comprising a network interface, wherein the processor is further configured to:
send data relating to an allocation of energy storage capacity available for at least one of demand response, frequency regulation, grid voltage regulation or local renewable energy optimization uses to an external control platform through the network interface;
receive an activation signal from the external control platform instructing through the network interface to implement power grid balancing functions; and
take the activation signal into account in determining the allocation of the energy storage capacity available for the different uses.

* * * * *